(12) United States Patent
Yoneyama et al.

(10) Patent No.: US 9,418,975 B1
(45) Date of Patent: Aug. 16, 2016

(54) SEMICONDUCTOR MODULE, POWER CONVERSION DEVICE, AND METHOD FOR MANUFACTURING SEMICONDUCTOR MODULE

(71) Applicant: Mitsubishi Electric Corporation, Tokyo (JP)

(72) Inventors: Rei Yoneyama, Tokyo (JP); Masayuki Ando, Tokyo (JP); Takehiro Araki, Fukuoka (JP); Yoshitaka Kimura, Tokyo (JP); Ryo Goto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/960,606

(22) Filed: Dec. 7, 2015

(30) Foreign Application Priority Data

Mar. 24, 2015 (JP) ................................. 2015-060348

(51) Int. Cl.
| | | |
|---|---|---|
| *H01L 29/40* | (2006.01) | |
| *H01L 25/18* | (2006.01) | |
| *H01L 23/498* | (2006.01) | |
| *H01L 25/00* | (2006.01) | |
| *H01L 23/04* | (2006.01) | |
| *H01L 29/16* | (2006.01) | |
| *H01L 29/20* | (2006.01) | |

(52) U.S. Cl.
CPC ................ *H01L 25/18* (2013.01); *H01L 23/04* (2013.01); *H01L 23/49844* (2013.01); *H01L 25/50* (2013.01); *H01L 29/1608* (2013.01); *H01L 29/2003* (2013.01)

(58) Field of Classification Search
CPC .................................. H01L 25/50; H01L 25/18
USPC .......................................................... 257/773
See application file for complete search history.

(56) References Cited

U.S. PATENT DOCUMENTS 5,512,782 A  * 4/1996 Kobayashi ............ H02M 7/003
                                                                 257/691
2008/0030913 A1    2/2008 Shirakawa et al.

FOREIGN PATENT DOCUMENTS

| JP | 2008-029052 A | 2/2008 |
| JP | 2008-166421 A | 7/2008 |
| JP | 2013-055739 A | 3/2013 |

* cited by examiner

*Primary Examiner* — Douglas Menz
(74) *Attorney, Agent, or Firm* — Studebaker & Brackett PC

(57) ABSTRACT

A semiconductor module has a first electrode terminal, a second electrode terminal, a third electrode terminal, a fourth electrode terminal, a fifth electrode terminal, and a sixth electrode terminal. The first electrode terminal and the second electrode terminal are arranged along a first direction. The third electrode terminal, the fourth electrode terminal, the fifth electrode terminal, and the sixth electrode terminal are arranged along a second direction perpendicular to the first direction. The first electrode terminal is arranged at a position where the first direction intersects with the second direction. The fourth electrode terminal, the fifth electrode terminal, and the sixth electrode terminal are AC output terminals or AC input terminals. The first electrode terminal is one of an anode terminal and a cathode terminal. At least one of the second electrode terminal and the third electrode terminal is the other of the anode terminal and the cathode terminal.

9 Claims, 6 Drawing Sheets

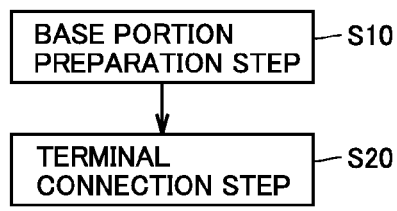
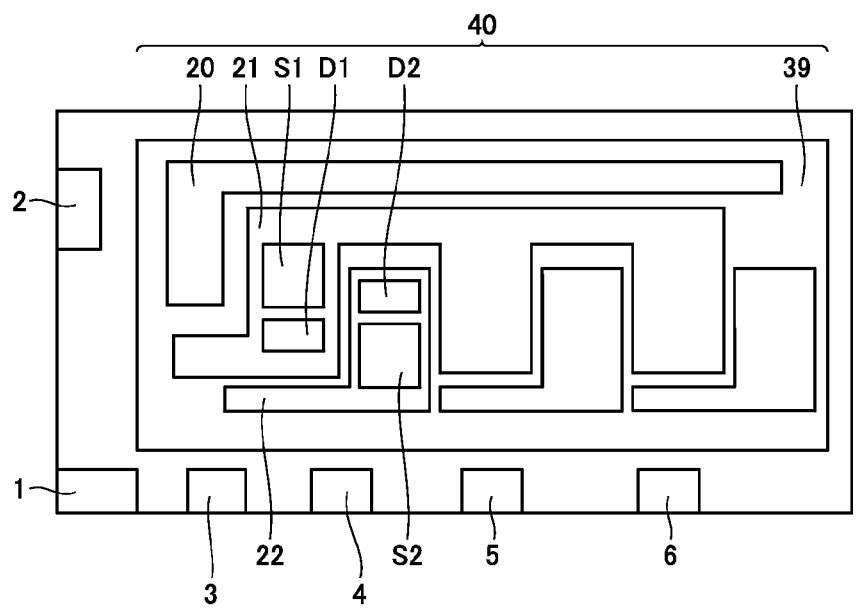
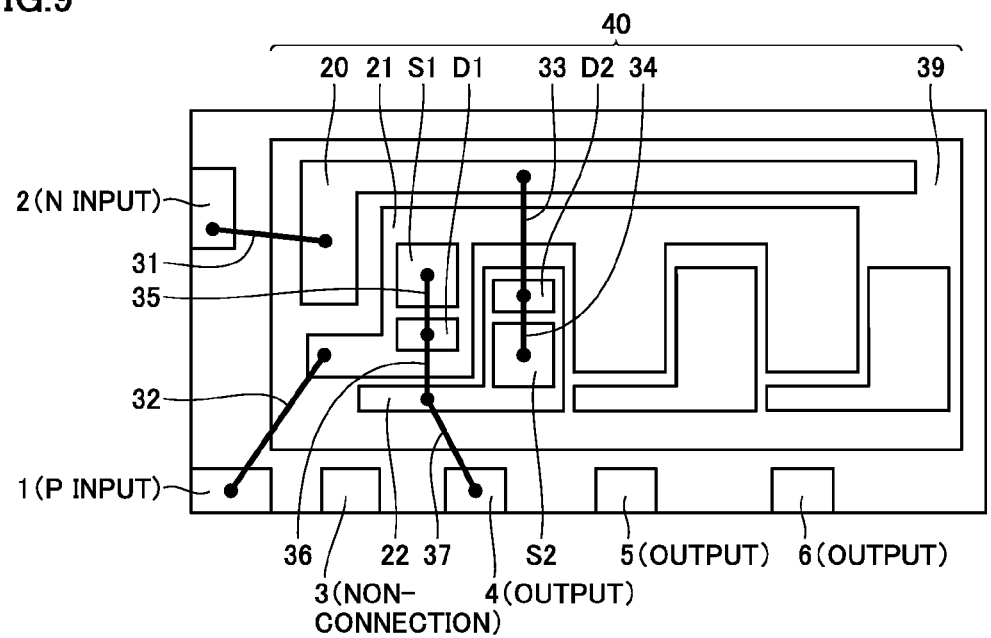

SEMICONDUCTOR MODULE, POWER CONVERSION DEVICE, AND METHOD FOR MANUFACTURING SEMICONDUCTOR MODULE

BACKGROUND OF THE INVENTION

1. Field of the Invention

The present invention relates to a semiconductor module, a power conversion device, and a method for manufacturing a semiconductor module. In particular, the present invention relates to a semiconductor module, a power conversion device, and a method for manufacturing a semiconductor module including electrode terminals.

2. Description of the Background Art

Conventionally, semiconductor modules which convert direct current (DC) power into three-phase (U-phase, V-phase, and W-phase) alternating current (AC) power are known. Such a semiconductor module has an anode terminal and a cathode terminal connected to a DC power source, and AC output terminals respectively corresponding to the U phase, the V phase, and the W phase (see, for example, Japanese Patent Laying-Open Nos. 2008-029052, 2008-166421, and 2013-055739). In a semiconductor module described in Japanese Patent Laying-Open No. 2008-029052, an anode terminal, a cathode terminal, and AC output terminals respectively corresponding to the U phase, the V phase, and the W phase are arranged in a straight line (this arrangement of the electrode terminals will be hereinafter referred to as in-line arrangement). In a semiconductor module described in Japanese Patent Laying-Open No. 2008-166421, a case provided with terminals has a substantially rectangular shape. AC output terminals respectively corresponding to the U phase, the V phase, and the W phase are arranged on a longer side, and an anode terminal and a cathode terminal are arranged on a shorter side, of the substantially rectangular shape (this arrangement of the electrode terminals will be hereinafter referred to as L-shaped arrangement).

SUMMARY OF THE INVENTION

In the case of the in-line arrangement, an anode terminal and a cathode terminal are arranged along a direction of a longer side of a case. On the other hand, in the L-shaped arrangement, an anode terminal and a cathode terminal are arranged along a direction of a shorter side of a case. That is, in any of the in-line arrangement and the L-shaped arrangement, the anode terminal and the cathode terminal are arranged along only one of the direction of the longer side and the direction of the shorter side. An electrode (bus bar) may be connected to a terminal of a semiconductor module, for connection with an external apparatus, for example. The bus bar is designed in consideration of the arrangement of the anode terminal and the cathode terminal in the semiconductor module. Specifically, inductance is increased with an increase in the length of the bus bar connecting a power source with the anode terminal or the cathode terminal. An increase in inductance results in a higher voltage surge during a switching operation. Accordingly, the bus bar is designed to have a short overall length. However, for example in a case where a semiconductor module adopting the in-line arrangement is connected with a semiconductor module adopting the L-shaped arrangement using a bus bar, since arrangement of an anode terminal or a cathode terminal differs in the in-line arrangement and the L-shaped arrangement, the semiconductor modules should be arranged, for example, such that the shorter side of the semiconductor module adopting the in-line arrangement faces the longer side of the semiconductor module adopting the L-shaped arrangement, in order to shorten the overall length of the bus bar. That is, for example in a case where semiconductor modules having different arrangements of terminals are electrically connected using a bus bar, arrangement of the semiconductor modules is limited.

The present invention has been made in view of the aforementioned problem, and one object of the present invention is to provide a semiconductor module, a power conversion device, and a method for manufacturing a semiconductor module capable of improving the degree of freedom in arranging the semiconductor module.

A semiconductor module in accordance with the present invention includes a first electrode terminal, a second electrode terminal, a third electrode terminal, a fourth electrode terminal, a fifth electrode terminal, and a sixth electrode terminal. The first electrode terminal and the second electrode terminal are arranged along a first direction. The third electrode terminal, the fourth electrode terminal, the fifth electrode terminal, and the sixth electrode terminal are arranged along a second direction perpendicular to the first direction. The first electrode terminal is arranged at a position where the first direction intersects with the second direction. The fourth electrode terminal, the fifth electrode terminal, and the sixth electrode terminal are AC output terminals or AC input terminals. The first electrode terminal is one of an anode terminal and a cathode terminal. At least one of the second electrode terminal and the third electrode terminal is the other of the anode terminal and the cathode terminal.

A method for manufacturing a semiconductor module in accordance with the present invention includes the steps of: preparing a base portion provided with a first electrode terminal and a second electrode terminal arranged along a first direction, a third electrode terminal, a fourth electrode terminal, a fifth electrode terminal, and a sixth electrode terminal arranged along a second direction perpendicular to the first direction, and an internal circuit, the first electrode terminal being arranged at a position where the first direction intersects with the second direction, the fourth electrode terminal, the fifth electrode terminal, and the sixth electrode terminal being AC output terminals or AC input terminals, the first electrode terminal being one of an anode terminal and a cathode terminal, at least one of the second electrode terminal and the third electrode terminal being the other of the anode terminal and the cathode terminal, the second electrode terminal being electrically insulated from the third electrode terminal; and electrically connecting at least one of the second electrode terminal and the third electrode terminal to the internal circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a flowchart schematically showing a method for manufacturing a semiconductor module in accordance with a sixth embodiment.

FIG. 8 is a plan view schematically showing a first step of the method for manufacturing the semiconductor module in accordance with the sixth embodiment.

FIG. 9 is a plan view schematically showing a first example of a second step of the method for manufacturing the semiconductor module in accordance with the sixth embodiment.

DESCRIPTION OF THE PREFERRED EMBODIMENTS

Figure 1:
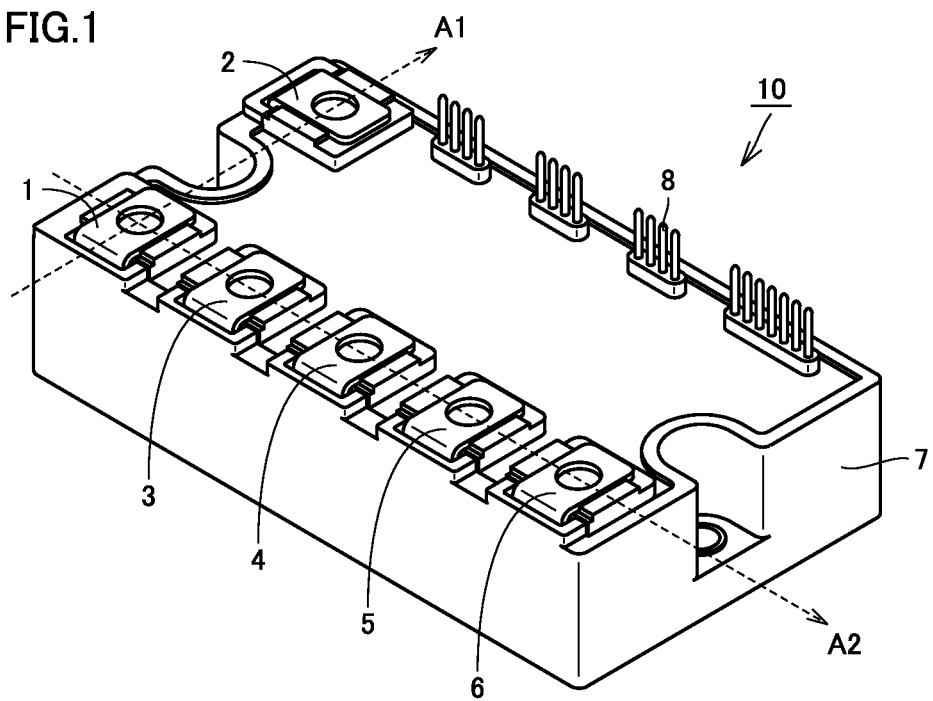
FIG. 1 is a perspective view schematically showing a configuration of a semiconductor module in accordance with each of first to third embodiments.

Hereinafter, embodiments of the present invention will be described with reference to the drawings. It should be noted that, in the drawings below, identical or corresponding parts will be designated by the same reference numerals, and the description thereof will not be repeated.

First Embodiment

A configuration of a semiconductor module in accordance with a first embodiment of the present invention will be described with reference to FIGS. 1 to 3. A semiconductor module 10 in accordance with the first embodiment mainly has a first electrode terminal 1, a second electrode terminal 2, a third electrode terminal 3, a fourth electrode terminal 4, a fifth electrode terminal 5, a sixth electrode terminal 6, a base portion 7, and a connection portion 8. As shown in FIG. 2, first electrode terminal 1 and second electrode terminal 2 are arranged along a first direction A1. Third electrode terminal 3, fourth electrode terminal 4, fifth electrode terminal 5, and sixth electrode terminal 6 are arranged along a second direction A2 perpendicular to first direction A1. First electrode terminal 1 is arranged at a position where first direction A1 intersects with second direction A2.

As shown in FIG. 2, in a plan view (when viewed from a direction perpendicular to a plane formed of first direction A1 and second direction A2), base portion 7 has an elongated shape, and specifically, base portion 7 has a substantially rectangular shape. First direction A1 is a direction of a shorter side of a rectangle. Second direction A2 is a direction of a longer side of the rectangle. As shown in FIG. 1, first electrode terminal 1, second electrode terminal 2, third electrode terminal 3, fourth electrode terminal 4, fifth electrode terminal 5, and sixth electrode terminal 6 are provided on base portion 7. First electrode terminal 1, second electrode terminal 2, third electrode terminal 3, fourth electrode terminal 4, fifth electrode terminal 5, and sixth electrode terminal 6 are provided on the same plane. First electrode terminal 1, second electrode terminal 2, third electrode terminal 3, fourth electrode terminal 4, fifth electrode terminal 5, and sixth electrode terminal 6 are physically spaced from each other. The distance between first electrode terminal 1 and second electrode terminal 2 may be larger than the distance between first electrode terminal 1 and third electrode terminal 3.

Figure 2:
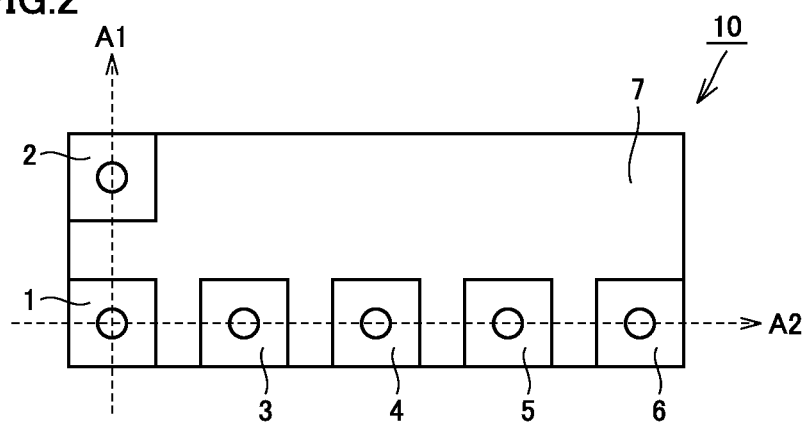
FIG. 2 is a plan view schematically showing the configuration of the semiconductor module in accordance with each of the first to third embodiments.

As shown in FIGS. 1 and 2, first electrode terminal 1, second electrode terminal 2, and sixth electrode terminal 6 are provided at corner portions of the surface of base portion 7. More specifically, first electrode terminal 1 and second electrode terminal 2 are respectively provided at the corner portions on one side and the other side in first direction A1. First electrode terminal 1 and sixth electrode terminal 6 are respectively provided at the corner portions on one side and the other side in second direction A2. Third electrode terminal 3, fourth electrode terminal 4, and fifth electrode terminal 5 are provided between first electrode terminal 1 and sixth electrode terminal 6. Third electrode terminal 3 is provided adjacent to first electrode terminal 1, and fifth electrode terminal 5 is provided adjacent to sixth electrode terminal 6. Fourth electrode terminal 4 is provided between third electrode terminal 3 and fifth electrode terminal 5. A depression which is circular in a plan view may be provided in the vicinity of the center of each of electrode terminals 1 to 6. Connection portion 8 is provided on base portion 7. A plurality of connection portions 8 may be provided along a direction which passes through second electrode terminal 2 and is parallel to second direction A2. Connection portion 8 is connected to, for example, a circuit which drives a gate. It should be noted that connection portion 8 is not shown in FIG. 2 and subsequent figures for the sake of simplification.

Figure 3:
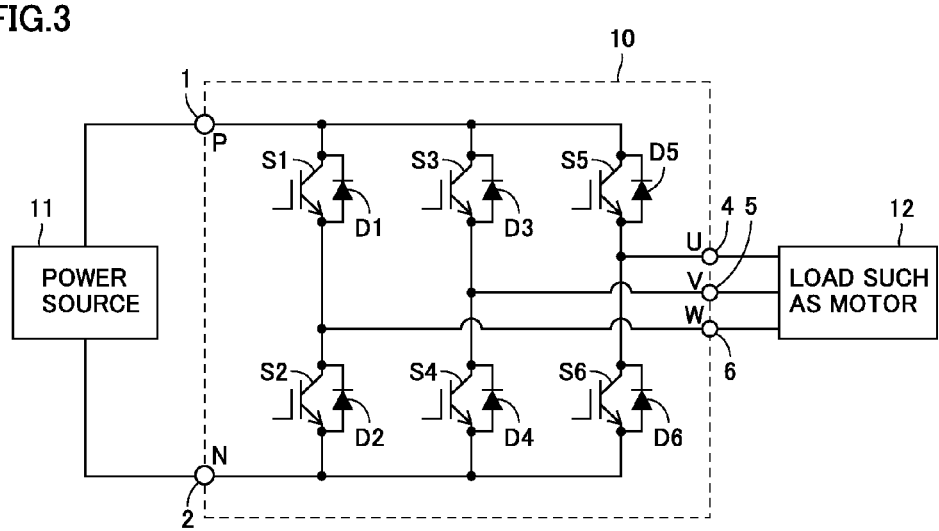
FIG. 3 is a circuit diagram schematically showing a circuit configuration of the semiconductor module in accordance with each of the first to third embodiments.

Referring to FIG. 3, semiconductor module 10 is an inverter, for example. Semiconductor module 10 further has semiconductor elements such as a transistor and a diode. Specifically, semiconductor module 10 has switching elements S1 to S6 and diodes D1 to D6, for example. Switching elements S1 to S6 are insulated gate bipolar transistors (IGBTs), for example. Diodes D1 to D6 are reflux diodes, for example. Preferably, the semiconductor elements are made of a wide bandgap semiconductor having a bandgap larger than that of silicon. Examples of the wide bandgap semiconductor include gallium nitride, silicon carbide, and the like. As shown in FIG. 3, the semiconductor elements such as IGBTs are electrically connected with, for example, each of first electrode terminal 1 and second electrode terminal 2.

As shown in FIG. 3, switching element S1 and diode D1 are connected in parallel to constitute a first arm switch unit. Similarly, switching element S2 and diode D2 are connected in parallel to constitute a second arm switch unit. A connection point between the first arm switch unit and the second arm switch unit is connected to sixth electrode terminal 6. Sixth electrode terminal 6 is a W-phase output terminal, for example. Similarly, switching element S3 and diode D3 are connected in parallel to constitute a third arm switch unit. Similarly, switching element S4 and diode D4 are connected in parallel to constitute a fourth arm switch unit. A connection point between the third arm switch unit and the fourth arm switch unit is connected to fifth electrode terminal 5. Fifth electrode terminal 5 is a V-phase output terminal, for example. Similarly, switching element S5 and diode D5 are connected in parallel to constitute a fifth arm switch unit. Similarly, switching element S6 and diode D6 are connected in parallel to constitute a sixth arm switch unit. A connection point between the fifth arm switch unit and the sixth arm switch unit is connected to fourth electrode terminal 4. Fourth electrode terminal 4 is a U-phase output terminal, for example.

Although the above description describes a case where fourth electrode terminal 4 is a U-phase AC output terminal, fifth electrode terminal 5 is a V-phase AC output terminal, and sixth electrode terminal 6 is a W-phase AC output terminal, the phase of each terminal is not limited to the phase described above. For example, fourth electrode terminal 4, fifth electrode terminal 5, and sixth electrode terminal 6 may be V-phase, W-phase, and U-phase AC output terminals, respectively, may be W-phase, U-phase, and V-phase AC output terminals, respectively, may be U-phase, W-phase, and V-phase AC output terminals, respectively, may be V-phase, U-phase, and W-phase AC output terminals, respectively, or may be W-phase, V-phase, and U-phase AC output terminals, respectively. Fourth electrode terminal 4, fifth electrode terminal 5, and sixth electrode terminal 6 are connectable to a load 12 such as a motor.

First electrode terminal 1 is connectable to, for example, an anode (a P side) of a DC power source 11. In other words, first electrode terminal 1 is an anode input terminal. First electrode terminal 1 is connected to the first arm switch unit, the third arm switch unit, and the fifth arm switch unit. Similarly, second electrode terminal 2 is connectable to, for example, a cathode (an N side) of DC power source 11. In other words, second electrode terminal 2 is a cathode input terminal Second electrode terminal 2 is connected to the second arm switch unit, the fourth arm switch unit, and the sixth arm switch unit.

Referring to FIG. 2 again, first electrode terminal 1 may be connectable to the anode (P side) of DC power source 11, second electrode terminal 2 may be connectable to the cathode (N type) of DC power source 11, and third electrode terminal 3 may be an output terminal connectable to a brake circuit (not shown). Alternatively, first electrode terminal 1 may be connectable to the cathode (N side) of DC power source 11, second electrode terminal 2 may be connectable to the anode (P type) of DC power source 11, and third electrode terminal 3 may be an output terminal connectable to the brake circuit. Alternatively, first electrode terminal 1 may be connectable to the anode (P side) of DC power source 11, third electrode terminal 3 may be connectable to the cathode (N type) of DC power source 11, and second electrode terminal 2 may be an output terminal connectable to the brake circuit. Alternatively, first electrode terminal 1 may be connectable to the cathode (N side) of DC power source 11, third electrode terminal 3 may be connectable to the anode (P type) of DC power source 11, and second electrode terminal 2 may be an output terminal connectable to the brake circuit. That is, first electrode terminal 1 is one of a DC anode terminal and a DC cathode terminal One of second electrode terminal 2 and third electrode terminal 3 is the other of the DC anode terminal and the DC cathode terminal. The other of second electrode terminal 2 and third electrode terminal 3 is an output terminal such as a brake output terminal. First electrode terminal 1 and at least one of second electrode terminal 2 and third electrode terminal 3 may be DC input terminals.

Next, the function and effect of the semiconductor module in accordance with the first embodiment of the present invention will be described.

In semiconductor module 10 in accordance with the first embodiment, first electrode terminal 1 and second electrode terminal 2 are arranged along first direction A1. Third electrode terminal 3, fourth electrode terminal 4, fifth electrode terminal 5, and sixth electrode terminal 6 are arranged along second direction A2 perpendicular to first direction A1. First electrode terminal 1 is arranged in at a position where first direction A1 intersects with second direction A2. Fourth electrode terminal 4, fifth electrode terminal 5, and sixth electrode terminal 6 are AC output terminals. First electrode terminal 1 is one of an anode terminal and a cathode terminal. At least one of second electrode terminal 2 and third electrode terminal 3 is the other of the anode terminal and the cathode terminal. Thereby, the anode terminal and the cathode terminal can be arranged along first direction A1, or can be arranged along second direction A2. Thus, the degree of freedom in arranging the semiconductor module can be improved. Further, the degree of freedom in designing a bus bar can be improved. Therefore, the design period for the semiconductor module can be shortened. Further, the semiconductor module can be standardized.

Further, in semiconductor module 10 in accordance with the first embodiment, fourth electrode terminal 4, fifth electrode terminal 5, and sixth electrode terminal 6 are AC output terminals. First electrode terminal 1 and at least one of second electrode terminal 2 and third electrode terminal 3 are DC input terminals. Thereby, the degree of freedom in arranging semiconductor module 10 utilized for example as an inverter can be improved.

Furthermore, in semiconductor module 10 in accordance with the first embodiment, one of second electrode terminal 2 and third electrode terminal 3 is the other of the anode terminal and the cathode terminal. The other of second electrode terminal 2 and third electrode terminal 3 is an output terminal. Thereby, the other of second electrode terminal 2 and third electrode terminal 3 can be effectively utilized as an output terminal such as a brake terminal.

Furthermore, semiconductor module 10 in accordance with the first embodiment further includes a semiconductor element electrically connected with the first electrode terminal. The semiconductor element is made of a wide bandgap semiconductor having a bandgap larger than that of silicon. A wide bandgap semiconductor such as SiC or GaN has a low loss during fast switching, and is excellent in high temperature tolerance, when compared with silicon semiconductor. Accordingly, the wide bandgap semiconductor is often used at a frequency higher than that of the condition used for a silicon semiconductor device (i.e., under a fast switching condition). When the wide bandgap semiconductor is used under the fast switching condition, dV/dt is increased, and thus it is required to reduce a surge voltage. The degree of freedom in arranging the semiconductor module is increased by utilizing the arrangement of the terminals of semiconductor module 10 described above. As a result, the degree of freedom in arranging a spanner for reducing surge is increased. Therefore, the semiconductor module in accordance with the first embodiment is suitably utilized when the semiconductor element is made of a wide bandgap semiconductor.

Second Embodiment

Next, a configuration of a semiconductor module in accordance with a second embodiment of the present invention will be described. The semiconductor module in accordance with the second embodiment is different from the semiconductor module in accordance with the first embodiment, mainly in that both of second electrode terminal 2 and third electrode terminal 3 are DC anode terminals or DC cathode terminals. Other than that, the semiconductor module in accordance with the second embodiment is substantially identical to the semiconductor module in accordance with the first embodiment.

Referring to FIGS. 1 and 2, first electrode terminal 1, second electrode terminal 2, and third electrode terminal 3 may be connectable to DC power source 11. Specifically, first electrode terminal 1 is connectable to the anode (P side) of DC power source 11, and second electrode terminal 2 and third electrode terminal 3 are connectable to the cathode (N side) of DC power source 11. In other words, first electrode terminal 1 is a DC anode input terminal, and second electrode terminal 2 and third electrode terminal 3 are DC cathode input terminals. Alternatively, first electrode terminal 1 may be connectable to the cathode (N side) of DC power source 11, and second electrode terminal 2 and third electrode terminal 3 may be connectable to the anode (P side) of DC power source 11. In other words, first electrode terminal 1 may be a DC cathode input terminal, and second electrode terminal 2 and third electrode terminal 3 may be DC anode input terminals. Second electrode terminal 2 and third electrode terminal 3 have the same electric potential.

Alternatively, first electrode terminal 1 may be a DC anode output terminal, and second electrode terminal 2 and third electrode terminal 3 may be DC cathode output terminals. Alternatively, first electrode terminal 1 may be a DC cathode output terminal, and second electrode terminal 2 and third electrode terminal 3 may be DC anode output terminals. That is, first electrode terminal 1 is one of a DC anode terminal and a DC cathode terminal, and both of second electrode terminal 2 and third electrode terminal 3 are the other of the DC anode terminal and the DC cathode terminal.

In semiconductor module 10 in accordance with the second embodiment, both of the second electrode terminal and the third electrode terminal are the other of the anode terminal and the cathode terminal. Thereby, the anode terminal and the cathode terminal connected to a main power source, for example, are arranged in two directions, i.e., first direction A1 and second direction A2. The degree of freedom in designing a bus bar can be improved. Further, the degree of freedom in arranging the semiconductor module can be improved.

Third Embodiment

Next, a configuration of a semiconductor module in accordance with a third embodiment of the present invention will be described. The semiconductor module in accordance with the third embodiment is different from the semiconductor module in accordance with the first embodiment, mainly in that one of second electrode terminal 2 and third electrode terminal 3 is a non-contact terminal. Other than that, the semiconductor module in accordance with the third embodiment is substantially identical to the semiconductor module in accordance with the first embodiment.

Referring to FIGS. 1 and 2, one of second electrode terminal 2 and third electrode terminal 3 may be a terminal which is not connected to DC power source 11, and the other of second electrode terminal 2 and third electrode terminal 3 may be a terminal which is connected to DC power source 11. For example, first electrode terminal 1 is connectable to the anode (P side) of DC power source 11, second electrode terminal 2 is connectable to the cathode (N side) of DC power source 11, and third electrode terminal 3 is not connected to DC power source 11. In other words, first electrode terminal 1 is a DC anode input terminal, second electrode terminal 2 is a DC cathode input terminal, and third electrode terminal 3 is a non-contact terminal. The non-contact terminal is not connected to any terminal other than the non-contact terminal. That is, the non-connection terminal has an electric potential insulated from an electric potential within the semiconductor module (i.e., a floating electric potential).

Alternatively, first electrode terminal 1 may be a DC cathode input terminal, second electrode terminal 2 may be a DC anode input terminal, and third electrode terminal 3 may be a non-contact terminal. Alternatively, first electrode terminal 1 may be a DC cathode input terminal, third electrode terminal 3 may be a DC anode input terminal, and second electrode terminal 2 may be a non-contact terminal. Alternatively, first electrode terminal 1 may be a DC anode input terminal, third electrode terminal 3 may be a DC cathode input terminal, and second electrode terminal 2 may be a non-contact terminal.

Alternatively, first electrode terminal 1 may be a DC anode output terminal, second electrode terminal 2 may be a DC cathode output terminal, and third electrode terminal 3 may be a non-contact terminal. Alternatively, first electrode terminal 1 may be a DC cathode output terminal, second electrode terminal 2 may be a DC anode output terminal, and third electrode terminal 3 may be a non-contact terminal. Alternatively, first electrode terminal 1 may be a DC cathode output terminal, third electrode terminal 3 may be a DC anode output terminal, and second electrode terminal 2 may be a non-contact terminal. Alternatively, first electrode terminal 1 may be a DC anode output terminal, third electrode terminal 3 may be a DC cathode output terminal, and second electrode terminal 2 may be a non-contact terminal. That is, in the third embodiment, first electrode terminal 1 is one of an anode terminal and a cathode terminal. One of second electrode terminal 2 and third electrode terminal 3 is the other of the anode terminal and the cathode terminal. The other of second electrode terminal 2 and third electrode terminal 3 is a non-connection terminal.

In semiconductor module 10 in accordance with the third embodiment, one of second electrode terminal 2 and third electrode terminal 3 is the other of the anode terminal and the cathode terminal. The other of second electrode terminal 2 and third electrode terminal 3 is a non-connection terminal. The non-connection terminal is electrically insulated from other terminals. Accordingly, the non-connection terminal can be utilized as a mechanical structural support for a circuit substrate, an electronic component, or the like which controls the semiconductor module. A more rigid casing structure can be obtained by an increase in members supporting the casing structure.

Fourth Embodiment

Next, a configuration of a power conversion device in accordance with a fourth embodiment of the present invention will be described. A power conversion device 100 in accordance with the fourth embodiment has at least one semiconductor module 10 according to the first to third embodiments, for example.

Figure 4:
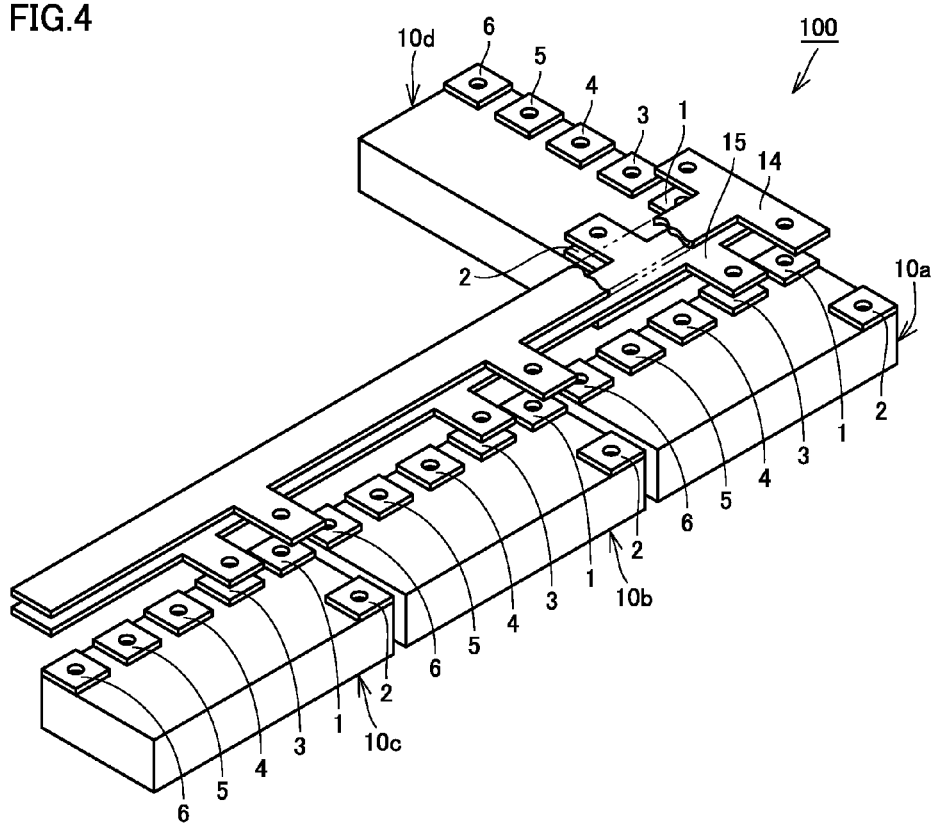
FIG. 4 is a perspective view schematically showing a configuration of a power conversion device in accordance with a fourth embodiment.

As shown in FIG. 4, power conversion device 100 mainly has, for example, a first semiconductor module 10a, a second semiconductor module 10b, a third semiconductor module 10c, a fourth semiconductor module 10d, a first bus bar 14, and a second bus bar 15. First semiconductor module 10a, second semiconductor module 10b, and third semiconductor module 10c are arranged along a longitudinal direction of base portion 7. Fourth semiconductor module 10d is arranged such that a short direction of fourth semiconductor module 10d is parallel to a longitudinal direction of first semiconductor module 10a. In other words, fourth semiconductor module 10d is provided such that the short direction of fourth semiconductor module 10d faces a longer side of first semiconductor module 10a. Fourth semiconductor module 10d is provided such that a shorter side of fourth semiconductor module 10d faces the longer side of first semiconductor module 10a.

First bus bar 14 and second bus bar 15 are plate-like electrode wirings. First bus bar 14 and second bus bar 15 are configured, for example, to be able to supply electric power to first electrode terminal 1, second electrode terminal 2, and third electrode terminal 3. First electrode terminal 1 of first semiconductor module 10a, first electrode terminal 1 of second semiconductor module 10b, first electrode terminal 1 of third semiconductor module 10c, and first electrode terminal 1 of fourth semiconductor module 10d are electrically connected by first bus bar 14. Similarly, third electrode terminal 3 of first semiconductor module 10a, third electrode terminal 3 of second semiconductor module 10b, third electrode terminal 3 of third semiconductor module 10c, and second electrode terminal 2 of fourth semiconductor module 10d are electrically connected by second bus bar 15. First electrode terminal 1 is an anode terminal, for example. Second electrode terminal 2 and third electrode terminal 3 are cathode terminals, for example. By connecting second bus bar 15 to second electrode terminal 2 instead of third electrode terminal 3 of fourth semiconductor module 10d as described above, the overall length of second bus bar 15 can be shortened.

Fifth Embodiment

Next, a configuration of a power conversion device in accordance with a fifth embodiment of the present invention will be described. Power conversion device 100 in accordance with the fifth embodiment has at least one semiconductor module 10 according to the first to third embodiments, for example. Power conversion device 100 is, for example, an inverter device, a converter device, a servo amplifier, or a power source unit.

Figure 5:
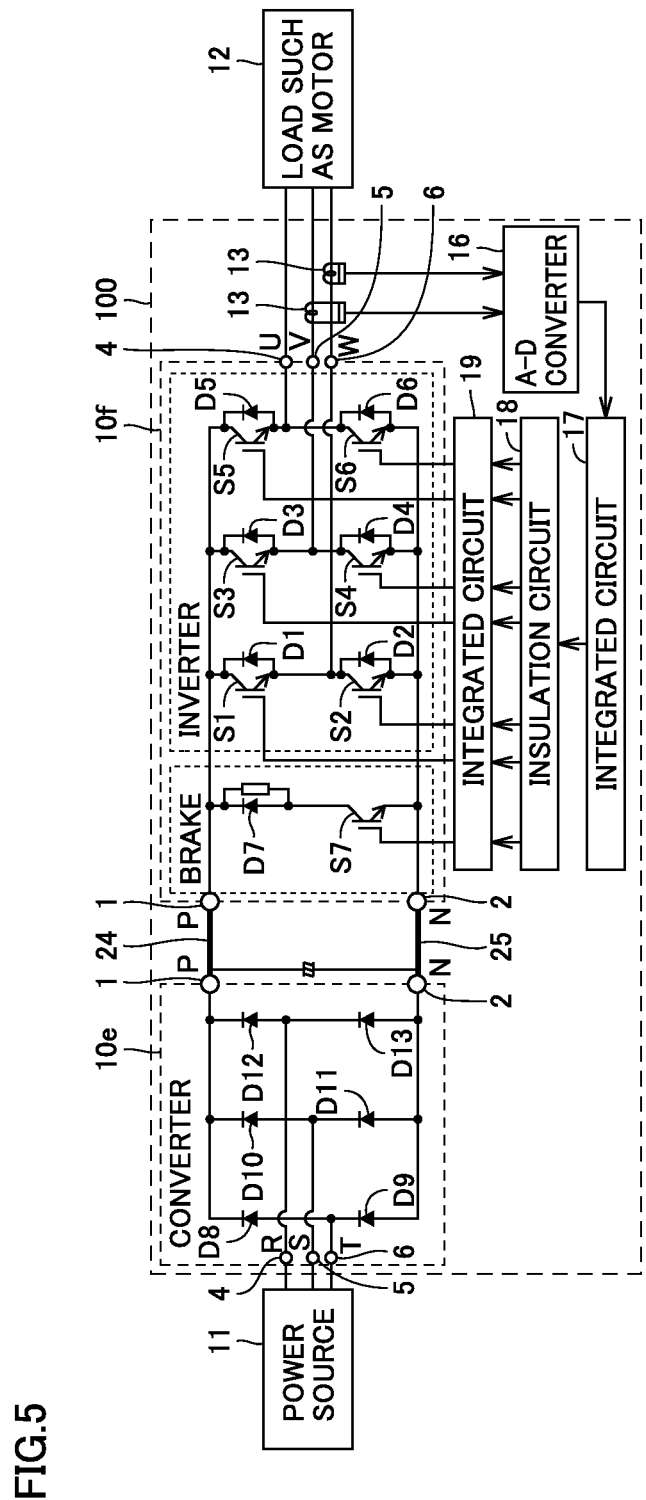
FIG. 5 is a circuit diagram schematically showing a first example of a power conversion device in accordance with a fifth embodiment.

As shown in FIG. 5, such power conversion device 100 mainly has, for example, a fifth semiconductor module 10e, a sixth semiconductor module 10f, an analog-digital (A-D) converter 16, an integrated circuit 17, an insulation circuit 18, an integrated circuit 19, a third bus bar 24, and a fourth bus bar 25. Fifth semiconductor module 10e is a converter, for example. Fifth semiconductor module 10e has diodes D8 to D13. A connection point between diode D8 and diode D9 is connected to sixth electrode terminal 6. Sixth electrode terminal 6 is a T-phase input terminal, for example. A connection point between diode D10 and diode D11 is connected to fifth electrode terminal 5. Fifth electrode terminal 5 is an S-phase input terminal, for example. A connection point between diode D12 and diode D13 is connected to fourth electrode terminal 4. Fourth electrode terminal 4 is an R-phase input terminal, for example. Fourth electrode terminal 4, fifth electrode terminal 5, and sixth electrode terminal 6 are provided to be connectable to AC power source 11.

Although the above description describes a case where fourth electrode terminal 4 is an R-phase AC input terminal, fifth electrode terminal 5 is an S-phase AC input terminal, and sixth electrode terminal 6 is a T-phase AC input terminal, the phase of each terminal is not limited to the phase described above. For example, fourth electrode terminal 4, fifth electrode terminal 5, and sixth electrode terminal 6 may be S-phase, T-phase, and R-phase AC input terminals, respectively, may be T-phase, R-phase, and S-phase AC input terminals, respectively, may be R-phase, T-phase, and S-phase AC input terminals, respectively, may be S-phase, R-phase, and T-phase AC input terminals, respectively, or may be T-phase, S-phase, and R-phase AC input terminals, respectively.

First electrode terminal 1 and second electrode terminal 2 are configured to be able to output DC. First electrode terminal 1 is an anode output terminal, for example. First electrode terminal 1 is connected to diode D8, diode D10, and diode D12. Second electrode terminal 2 is a cathode output terminal, for example. Second electrode terminal 2 is connected to diode D9, diode D11, and diode D13. Third electrode terminal 3 instead of second electrode terminal 2 may be connected to diode D9, diode D11, and diode D13, or both of second electrode terminal 2 and third electrode terminal 3 may be connected to diode D9, diode D11, and diode D13. That is, the first electrode terminal and at least one of the second electrode terminal and the third electrode terminal may be DC output terminals.

As shown in FIG. 5, sixth semiconductor module 10f has an inverter circuit and a brake circuit, for example. The inverter circuit has a configuration which is substantially identical to the configuration described in the first embodiment. The brake circuit has a diode D7 and a switching element S7. Diode D7 is connected to first electrode terminal 1. Switching element S7 is connected to second electrode terminal 2. An output electrode terminal of the brake circuit may be provided in sixth semiconductor module 10f. A current sensor 13 is configured to be able to detect an AC current. Current sensor 13 is provided, for example, to a wiring which connects sixth electrode terminal 6 and load 12 such as a motor. Current sensor 13 may be provided, for example, to a wiring which connects fifth electrode terminal 5 and load 12 such as a motor. A signal detected by current sensor 13 is sent to A-D converter 16. In A-D converter 16, the signal detected by current sensor 13 is subjected to A-D conversion. The signal subjected to A-D conversion is sent to integrated circuit 17. Integrated circuit 17 is a microcomputer/digital signal processor (DSP), for example. Integrated circuit 17 is connected to insulation circuit 18. Insulation circuit 18 is connected to integrated circuit 19. Integrated circuit 19 is a drive/protection circuit. Integrated circuit 19 controls gates of switching elements S1 to S7, for example.

As shown in FIG. 5, first electrode terminal 1 of fifth semiconductor module 10e is connected to first electrode terminal 1 of sixth semiconductor module 10f by third bus bar 24. Similarly, second electrode terminal 2 of fifth semiconductor module 10e is connected to second electrode terminal 2 of sixth semiconductor module 10f by fourth bus bar 25. As shown in FIG. 5, first electrode terminal 1 and second electrode terminal 2 of fifth semiconductor module 10e are DC output terminals, and fourth electrode terminal 4, fifth electrode terminal 5, and sixth electrode terminal 6 of fifth semiconductor module 10e are AC input terminals. On the other hand, first electrode terminal 1 and second electrode terminal 2 of sixth semiconductor module 10f are DC input terminals, and fourth electrode terminal 4, fifth electrode terminal 5, and sixth electrode terminal 6 of sixth semiconductor module 10f are AC output terminals.

When fourth electrode terminal 4, fifth electrode terminal 5, and sixth electrode terminal 6 are AC input terminals, first electrode terminal 1 is one of an anode output terminal and a cathode output terminal, and at least one of second electrode terminal 2 and third electrode terminal 3 is the other of the anode output terminal and the cathode output terminal. When fourth electrode terminal 4, fifth electrode terminal 5, and sixth electrode terminal 6 are AC output terminals, first electrode terminal 1 is one of an anode input terminal and a cathode input terminal, and at least one of second electrode terminal 2 and third electrode terminal 3 is the other of the anode input terminal and the cathode input terminal.

Figure 6:
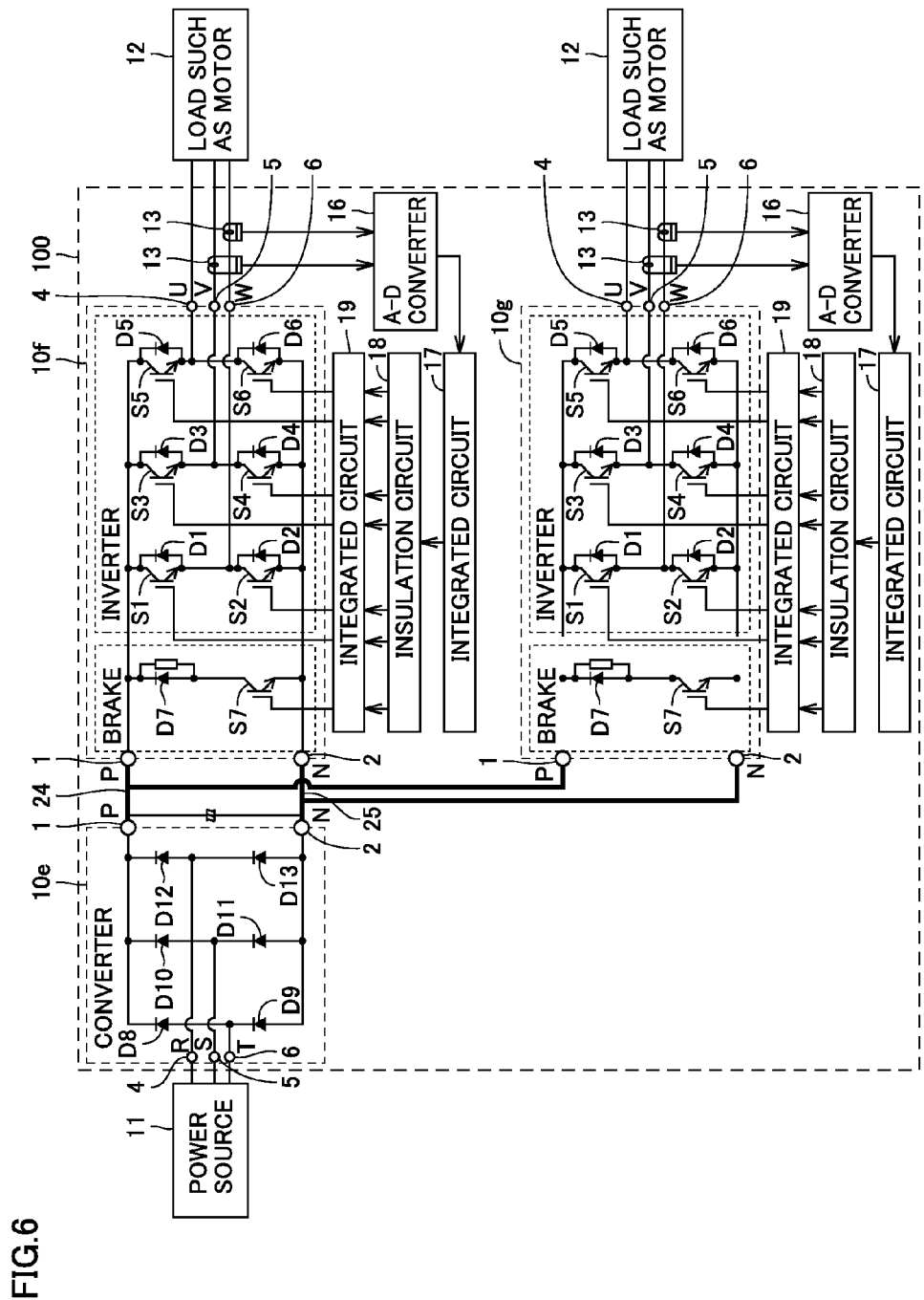
FIG. 6 is a circuit diagram schematically showing a second example of the power conversion device in accordance with the fifth embodiment.

Power conversion device 100 may further have a seventh semiconductor module 10g, as shown in FIG. 6. Since the configuration of seventh semiconductor module 10g is substantially identical to that of sixth semiconductor module 10f, a detailed description will not be repeated. First electrode terminal 1 of fifth semiconductor module 10e, first electrode terminal 1 of sixth semiconductor module 10f, and first electrode terminal 1 of seventh semiconductor module 10g are connected by third bus bar 24. Similarly, second electrode terminal 2 of fifth semiconductor module 10e, second electrode terminal 2 of sixth semiconductor module 10f, and second electrode terminal 2 of seventh semiconductor module 10g are connected by fourth bus bar 25.

In fifth semiconductor module 10e in accordance with the fifth embodiment, fourth electrode terminal 4, fifth electrode terminal 5, and sixth electrode terminal 6 are AC input terminals. First electrode terminal 1 and at least one of second electrode terminal 2 and third electrode terminal 3 are DC output terminals. Thereby, the degree of freedom in arranging semiconductor module 10 utilized for example as a converter can be improved.

Further, in power conversion device 100 in accordance with the fifth embodiment, since the degree of freedom in arranging each of a plurality of semiconductor modules 10 is high, the plurality of semiconductor modules 10 can be arranged in a compact manner. As a result, power conversion device 100 can be downsized. Further, an increase in inductance can be suppressed by optimizing arrangement of the bus bars. Therefore, there is no need to add a spanner for suppressing voltage surge, and thus power conversion device 100 can be further downsized.

Sixth Embodiment

Next, an example of a method for manufacturing the semiconductor module will be described.

First, a base portion preparation step (S10: FIG. 7) is performed. Referring to FIG. 8, a base portion (case) provided with first electrode terminal 1, second electrode terminal 2, third electrode terminal 3, fourth electrode terminal 4, fifth electrode terminal 5, sixth electrode terminal 6, and an internal circuit 40 is prepared. First electrode terminal 1 and second electrode terminal 2 are arranged along first direction A1. Third electrode terminal 3, fourth electrode terminal 4, fifth electrode terminal 5, and sixth electrode terminal 6 are arranged along second direction A2 perpendicular to first direction A1. First electrode terminal 1 is arranged at a position where first direction A1 intersects with second direction A2.

Fourth electrode terminal 4, fifth electrode terminal 5, and sixth electrode terminal 6 are AC output terminals, for example. Fourth electrode terminal 4, fifth electrode terminal 5, and sixth electrode terminal 6 may be AC input terminals. First electrode terminal 1 is one of an anode terminal and a cathode terminal. At least one of second electrode terminal 2 and third electrode terminal 3 is the other of the anode terminal and the cathode terminal. Electrode terminals 1 to 6 are electrically insulated from each other. Specifically, second electrode terminal 2 is electrically insulated from third electrode terminal 3. Similarly, second electrode terminal 2 is electrically insulated from first electrode terminal 1. Similarly, first electrode terminal 1 is electrically insulated from third electrode terminal 3.

Internal circuit 40 mainly has, for example, wirings 20, 21, and 22, switching elements S1 and S2, diodes D1 and D2, and a substrate 39, as shown in FIG. 8. Wirings 20, 21, and 22 are arranged on substrate 39 to be separated from each other. Switching element S1 and diode D1 are arranged on wiring 21. Switching element S2 and diode D2 are arranged on wiring 22.

Next, a terminal connection step (S20: FIG. 7) is performed. Specifically, electrode terminals 1 to 6 are connected to internal circuit 40 as shown in FIG. 9. Referring to FIG. 9, first electrode terminal 1 is connected to wiring 21 using a wire 32. Second electrode terminal 2 is connected to wiring 20 using a wire 31. Third electrode terminal 3 is not connected to any other electrode terminal Third electrode terminal 3 is not connected to internal circuit 40. In other words, third electrode terminal 3 is utilized as a non-connection terminal. Fourth electrode terminal 4 is connected to wiring 22 using a wire 37. Wiring 22 is connected to diode D1 using a wire 36. Diode D1 is connected to switching element S1 using a wire 35. Wiring 20 is connected to diode D2 using a wire 33. Diode D2 is connected to switching element S2 using a wire 34. First electrode terminal 1 and second electrode terminal 2 are utilized as DC input terminals. First electrode terminal 1 is utilized as an anode terminal, and second electrode terminal 2 is utilized as a cathode terminal. Fourth electrode terminal 4, fifth electrode terminal 5, and sixth electrode terminal 6 are utilized as AC output terminals.

Figure 10:
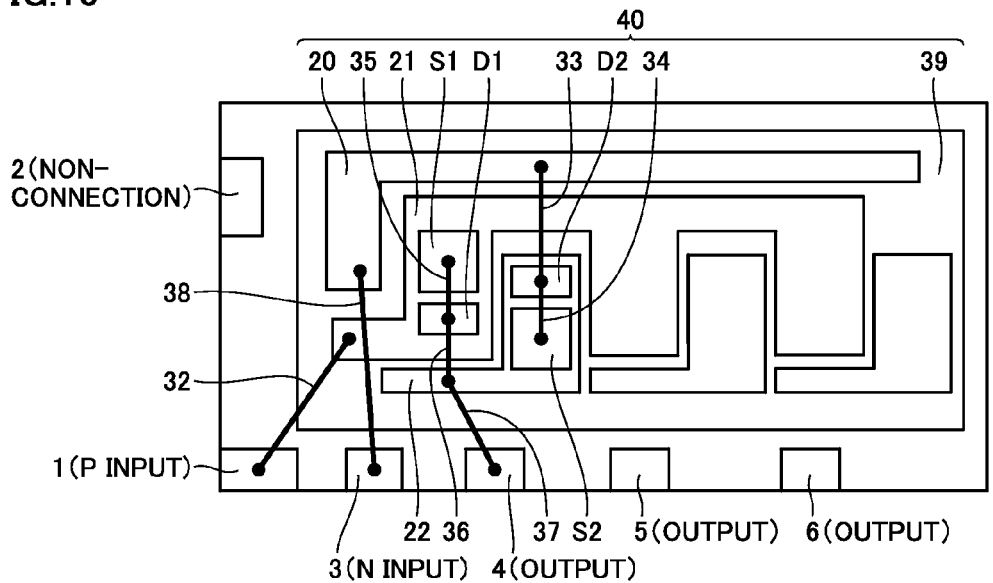
FIG. 10 is a plan view schematically showing a second example of the second step of the method for manufacturing the semiconductor module in accordance with the sixth embodiment.

In the terminal connection step (S20: FIG. 7), electrode terminals 1 to 6 may be connected to internal circuit 40 as shown in FIG. 10. Referring to FIG. 10, first electrode terminal 1 is connected to wiring 21 using wire 32. Third electrode terminal 3 is connected to wiring 20 using a wire 38. Second electrode terminal 2 is not connected to any other electrode terminal Second electrode terminal 2 is not connected to internal circuit 40. In other words, second electrode terminal 2 is utilized as a non-connection terminal. First electrode terminal 1 and third electrode terminal 3 are utilized as DC input terminals. First electrode terminal 1 is utilized as an anode terminal, and third electrode terminal 3 is utilized as a cathode terminal Fourth electrode terminal 4, fifth electrode terminal 5, and sixth electrode terminal 6 are utilized as AC output terminals. Other than that, the configuration is identical to that described in FIG. 9.

Figure 11:
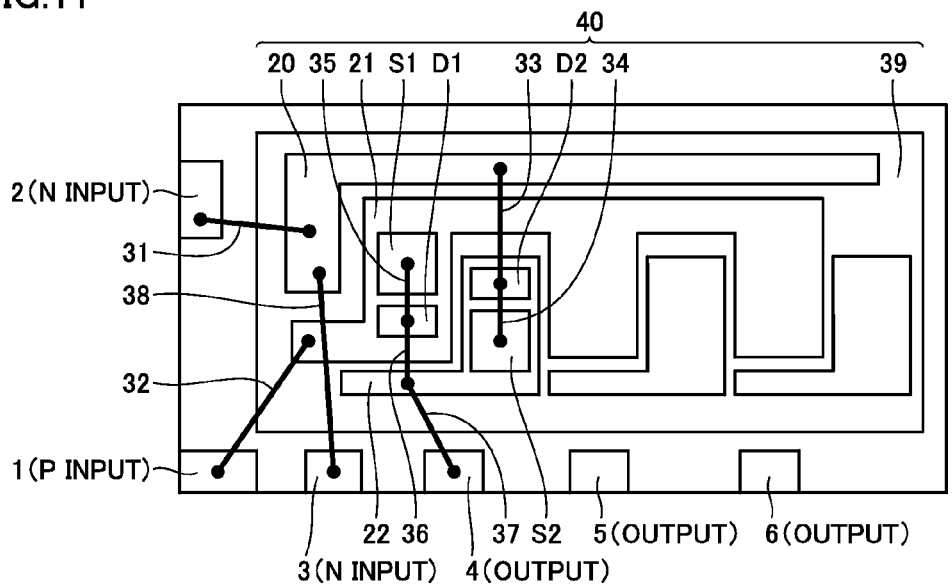
FIG. 11 is a plan view schematically showing a third example of the second step of the method for manufacturing the semiconductor module in accordance with the sixth embodiment.

In the terminal connection step (S20: FIG. 7), electrode terminals 1 to 6 may be connected to internal circuit 40 as shown in FIG. 11. Referring to FIG. 11, first electrode terminal 1 is connected to wiring 21 using wire 32. Third electrode terminal 3 is connected to wiring 20 using wire 38. Second electrode terminal 2 is connected to wiring 20 using wire 31. First electrode terminal 1, second electrode terminal 2, and third electrode terminal 3 are utilized as DC input terminals. First electrode terminal 1 is utilized as an anode terminal, and second electrode terminal 2 and third electrode terminal 3 are utilized as cathode terminals. Fourth electrode terminal 4, fifth electrode terminal 5, and sixth electrode terminal 6 are utilized as AC output terminals. Other than that, the configuration is identical to that described in FIG. 9.

It should be noted that the wires which electrically connect electrode terminals 1 to 6 and internal circuit 40 may be made of a material such as aluminum or gold, for example. Further, a metal plate or the like may be used instead of a wire. Members may be joined by wire bonding as described above, or may be joined by solder joining or ultrasonic joining.

As shown in FIGS. 9 to 11, in the method for manufacturing semiconductor module 10 in accordance with the sixth embodiment, at least one of second electrode terminal 2 and third electrode terminal 3 is electrically connected to internal circuit 40. That is, only one of second electrode terminal 2 and third electrode terminal 3 may be connected to internal circuit 40, or both of second electrode terminal 2 and third electrode terminal 3 may be connected to internal circuit 40. In other words, connection of second electrode terminal 2 and third electrode terminal 3 to internal circuit 40 is selectively performed. Each of second electrode terminal 2 and third electrode terminal 3 only has to be provided on base portion 7 to be connectable to internal circuit 40, and may be connected to internal circuit 40 or does not have to be connected to internal circuit 40. Thus, second electrode terminal 2 is electrically insulated from third electrode terminal 3 within base portion 7. In an assembly stage of semiconductor module 10, electrical connection or non-connection of second electrode terminal 2 and third electrode terminal 3 to internal circuit 40 is selectively performed. That is, three types of semiconductor modules 10 shown in FIGS. 9 to 11 can be fabricated by using one structure shown in FIG. 8 and changing connection of the wires in the assembly stage. Thus, since a common structure can be used prior to the assembly stage, management of components of semiconductor module 10 can be simplified. Further, the process of manufacturing semiconductor module 10 can be communalized. Accordingly, lead time for manufacturing semiconductor module 10 can be shortened.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A semiconductor module, comprising:
   a first electrode terminal and a second electrode terminal arranged along a first direction; and
   a third electrode terminal, a fourth electrode terminal, a fifth electrode terminal, and a sixth electrode terminal arranged along a second direction perpendicular to said first direction,
   said first electrode terminal being arranged at a position where said first direction intersects with said second direction,
   said third electrode terminal is positioned adjacent to said first electrode along said second direction,
   said fourth electrode terminal, said fifth electrode terminal, and said sixth electrode terminal being AC output terminals or AC input terminals,
   said first electrode terminal being one of an anode terminal and a cathode terminal,
   at least one of said second electrode terminal and said third electrode terminal being the other of said anode terminal and said cathode terminal, and
   the other of said second electrode terminal and said third electrode terminal being also the other of said anode terminal and said cathode terminal or being a non-connection terminal.

2. The semiconductor module according to claim 1, wherein
   said fourth electrode terminal, said fifth electrode terminal, and said sixth electrode terminal are AC output terminals, and
   said first electrode terminal and at least one of said second electrode terminal and said third electrode terminal are DC input terminals.

3. The semiconductor module according to claim 1, wherein one of said second electrode terminal and said third electrode terminal is the other of said anode terminal and said cathode terminal, and the other of said second electrode terminal and said third electrode terminal is an output terminal.

4. The semiconductor module according to claim 1, wherein both of said second electrode terminal and said third electrode terminal are the other of said anode terminal and said cathode terminal.

5. The semiconductor module according to claim 1, wherein one of said second electrode terminal and said third electrode terminal is the other of said anode terminal and said cathode terminal, and the other of said second electrode terminal and said third electrode terminal is a non-connection terminal.

6. The semiconductor module according to claim 1, further comprising a semiconductor element electrically connected with said first electrode terminal, wherein
   said semiconductor element is made of a wide bandgap semiconductor having a bandgap larger than that of silicon.

7. The semiconductor module according to claim 1, wherein
   said fourth electrode terminal, said fifth electrode terminal, and said sixth electrode terminal are AC input terminals, and
   said first electrode terminal and at least one of said second electrode terminal and said third electrode terminal are DC output terminals.

8. A power conversion device, comprising at least one semiconductor module as recited in claim 1.

9. A method for manufacturing a semiconductor module, comprising the steps of:
   preparing a base portion provided with a first electrode terminal and a second electrode terminal arranged along a first direction, a third electrode terminal, a fourth electrode terminal, a fifth electrode terminal, and a sixth electrode terminal arranged along a second direction perpendicular to said first direction, and an internal circuit,
   said first electrode terminal being arranged at a position where said first direction intersects with said second direction,
   said third electrode terminal is positioned adjacent to said first electrode along said second direction,
   said fourth electrode terminal, said fifth electrode terminal, and said sixth electrode terminal being AC output terminals or AC input terminals,
   said first electrode terminal being one of an anode terminal and a cathode terminal,
   at least one of said second electrode terminal and said third electrode terminal being the other of said anode terminal and said cathode terminal,
   said second electrode terminal being electrically insulated from said third electrode terminal, and
   the other of said second electrode terminal and said third electrode terminal being also the other of said anode terminal and said cathode terminal or being a non-connection terminal; and
   electrically connecting at least one of said second electrode terminal and said third electrode terminal to said internal circuit.

* * * * *